(12) United States Patent
Heintz (10) Patent No.: US 12,040,791 B2
(45) Date of Patent: Jul. 16, 2024

(54) INDUCTION SENSOR ASSEMBLY OF A SECURING AND LOCKING UNIT OF A TELESCOPING JIB OF A VEHICLE CRANE

(71) Applicant: Tadano Demag GmbH, Zweibrücken (DE)

(72) Inventor: Rolf Heintz, Langwieden (DE)

(73) Assignee: Tadano Demag GmbH, Zweibrücken (DE)

( * ) Notice: Subject to any disclaimer, the term of this patent is extended or adjusted under 35 U.S.C. 154(b) by 546 days.

(21) Appl. No.: 17/232,753

(22) Filed: Apr. 16, 2021

(65) Prior Publication Data

US 2021/0323798 A1 Oct. 21, 2021

(30) Foreign Application Priority Data

Apr. 17, 2020 (DE) .......................... 102020110481.2

(51) Int. Cl.
  *H03K 17/95* (2006.01)
  *B66C 13/46* (2006.01)
  *G01D 5/20* (2006.01)

(52) U.S. Cl.
  CPC ........... *H03K 17/9505* (2013.01); *G01D 5/20* (2013.01)

(58) Field of Classification Search
  CPC ........ B66C 13/46; B66C 13/50; B66C 23/708
  See application file for complete search history.

(56) References Cited

U.S. PATENT DOCUMENTS

| 4,544,985 A * | 10/1985 | Metz ...................... H01F 7/206 336/136 |
| 2001/0050538 A1 * | 12/2001 | Kovach ..................... E06B 9/32 318/16 |
| 2005/0046584 A1 * | 3/2005 | Breed ................... G06F 3/0237 340/13.31 |

(Continued)

FOREIGN PATENT DOCUMENTS

| DE | 286533 A5 | 1/1991 |
| DE | 10004838 A1 | 9/2000 |
| DE | 10223449 B4 | 3/2005 |

(Continued)

*Primary Examiner* — Jermele M Hollington
*Assistant Examiner* — Temilade S Rhodes-Vivour
(74) *Attorney, Agent, or Firm* — Gardner, Linn, Burkhart & Ondersma LLP (57) ABSTRACT

An induction sensor assembly for a securing and locking unit of a telescoping jib having at least one signal transmitter configured for generating an electromagnetic stray field oriented towards its active switching surface, and at least one switching element provided for contactless cooperation with the signal transmitter. The signal transmitter and switching element are displaceable relative to each other in relation to an adjusting direction extending in parallel with a main plane. To provide a simple and cost-effective installation of the induction sensor assembly despite having high detection security, the active switching surface of the signal transmitter and the main plane are inclined with respect to each other. As such, the electromagnetic stray field of the signal transmitter is also advantageously inclined whereby a possible displacement between the signal transmitter and switching element cannot exert an influence on the precision of the position detection in relation to the adjusting direction.

20 Claims, 5 Drawing Sheets

(56) References Cited

U.S. PATENT DOCUMENTS

2012/0173094 A1* 7/2012 Steinich .................. B66C 23/78
  701/50
2016/0233687 A1* 8/2016 McKernan .............. B66F 9/183

FOREIGN PATENT DOCUMENTS

| DE | 202004009019 U1 | 12/2005 |
| DE | 102008035583 A1 | 2/2010 |
| DE | 102009008557 A1 | 9/2010 |
| DE | 202016101500 U1 | 6/2016 |
| DE | 102018127157 B3 | 12/2019 |
| EP | 1153875 A1 | 11/2001 |

* cited by examiner

INDUCTION SENSOR ASSEMBLY OF A SECURING AND LOCKING UNIT OF A TELESCOPING JIB OF A VEHICLE CRANE

CROSS REFERENCE TO RELATED APPLICATION

The present application claims the priority benefits of German Application No. 10 2020 110 481.2, filed Apr. 17, 2020.

BACKGROUND AND FIELD OF THE INVENTION

The invention relates to an induction sensor assembly of a securing and locking unit of a telescoping jib of a vehicle crane, more particularly a mobile crane, comprising at least one signal transmitter, which is configured to generate an electromagnetic stray field oriented towards its active switching surface, and at least one switching element that is provided for contactless cooperation with the signal transmitter, wherein the signal transmitter and the switching element can be displaced relative to each other in relation to an adjusting direction extending in parallel with a main plane. Furthermore, the invention relates to a securing and locking unit having such an induction sensor assembly and to a telescoping jib having the securing and locking unit or such an induction sensor assembly. Lastly, the invention also relates to a crane having a telescoping jib equipped in such a manner.

Within engineering, diverse applications are known in which a detection is to be made as to when components which can move relative to one another come closer to one another. Typically, this detection is used to confirm that the components have reached or left a position to be monitored. This can be used e.g. to initiate continuous switching processes in manual or automated form. Conventionally, the detection is based on the use of suitable signal transmitters. These can be formed as pure sensors or switches. The function thereof can differ by virtue of whether or not they require physical contact with the components. As an example of signal transmitters operating in a contactless manner, proximity switches are already sufficiently well known. They can operate, for example, in the following ways: inductively, capacitively, optically, temperature-controlled or pressure-controlled.

The mode of operation of a signal transmitter formed as an inductive proximity switch is based on the creation of an electromagnetic stray field which can be generated by a transmitter coil driven by an oscillator. An interaction between this electromagnetic stray field and an object to be detected can be detected by an evaluation unit which is, for example, a component of the proximity switch. In this manner, when a particular signal level, i.e. threshold value, is reached, a switching signal can be output, which signal is mostly a binary on/off signal. The point at which the switching signal is output is also called a switching point. An inductive proximity switch is previously known from the German patent DE 10 2018 127 157 B3.

Such a signal transmitter has a detection region typically located at one of its ends. Said end is used as an active switching surface and the electromagnetic stray field leaving the signal transmitter is oriented towards said surface. The configuration of the stray field defining the detection region is specific for each signal transmitter and can additionally be dependent on its installation mode and position. Nevertheless, the electromagnetic stray field can be described as a substantially conical rotationally-symmetrical form having a curved periphery. In simple terms, the stray field has, in the central section, the shape of a triangle, more particularly an equilateral triangle, whose sides extending from the bottom towards the tip are curved away from each other. Said curvature is also referred to as a response curve. Since it does not have any sharp boundaries, but rather—owing to the delay between cause and effect—is subjected to a corresponding hysteresis, the response curve can additionally be divided into a switch-on curve and a switch-off curve. Therefore, the response curve also fixes the switching distance which an approaching object has to reach in order to be deemed to be detected by the signal transmitter.

In particular, hydraulically operated telescoping jibs require that their inner boxes (sections), which are individually extendible from the basic box, are secured in order to fix them in their relative position with respect to each other. This typically occurs using a securing and locking unit (SLU). The locking option therefor is effected via bolts which are moved into a corresponding recess when the extended position of the respective inner box is reached. Since the mutually corresponding components of this locking arrangement are located outside the visible range, it requires precise detection in relation to the position of the inner boxes in order to be able to implement the thus possible locking securely. A typical locking arrangement for the inner boxes is apparent e.g. from the German laid-open document DE 100 04 838 A1.

German patent DE 102 23 449 B4 discloses a purely mechanical option for detecting the position of the inner boxes of a telescoping jib with respect to each other, which is based on measurement value recorders corresponding to a sensing device. The rotatable measurement value recorders have, for this purpose, a collar with teeth which are engaged with touch bolts of the sensing device.

Another crane telescoping jib having basic boxes and inner boxes and a securing and locking unit is also already known from German utility model DE 20 2016 101 500 U1. In order to determine an extended position of the respective inner box, a measuring device is arranged in each case on adjacent boxes and is formed of a reading head and magnetic measuring rods which can be inductively read by the reading head.

Furthermore, an inductive measuring device for contactless measuring of the distance between a flame cutter and a workpiece surface is known from German patent DD 286 533 A5 for the field of flame-cutting. The inductive measuring device consists substantially of an inductive rod sensor which is oriented with its sensor axis at an angle to a normal on the workpiece surface and is directed towards the cutting region of the flame cutter. The flame cutter is also oriented at an angle to the normal. Owing to the angular orientation of the rod sensor, this can be arranged safely within a so-called flame shadow of the flame cutter with a minimum amount of thermal protection, and thus can be operated in a stable manner in an optimum electrical operating range.

German laid-open document DE 10 2009 008 557 A1 discloses a telescoping jib having a telescoping system which has signal transmitters formed as inductive proximity switches. These cooperate with associated switching elements which are attached to a suitable point of the telescoping jib. The switching elements have a surface provided for detection by the electromagnetic stray field, extending in parallel with the active switching surface of the signal transmitters.

The signal transmitters formed as inductive proximity switches can be used in this case for position recognition in order to automatically lock and unlock the bolts of the inner boxes which can move linearly in relation to an adjusting direction. In addition to an installation which is of millimeter precision, this arrangement presupposes above all a parallel distance guide between the signal transmitters and switching elements in order to allow position recognition which operates in a frictionless manner. Any displacement between the signal transmitters and switching elements perpendicular to the adjusting direction inevitably leads to a change in the switching points of the signal transmitters. This is due to the shape of the detection region or of the electromagnetic stray field, explained in more detail above. For instance, just a slight displacement of the signal transmitter towards the tip of the stray field can mean that it lies outside the detection region. In contrast, a displacement in the opposite direction would result in the switching element entering the detection region and thus in the detection thereof, although the relative position of the inner boxes in relation to the adjusting direction would remain unchanged. A signal could hereby be triggered for locking the securing and locking unit, even though the bolt thereof is not yet in its correct position with respect to the associated recess. As a result, the bolt would be moved against the wall of the respective inner box which can result, in addition to possible damage, in particular in the failure of locking of at least one inner box. In view of these observations, there is therefore still room for the assembly of such induction sensors to be improved.

SUMMARY OF THE INVENTION

The present invention provides an improved induction sensor assembly of a securing and locking unit to such an extent that it permits a simpler and overall more cost-effective installation despite having high detection security. Furthermore, a securing and locking unit configured in this manner and a telescoping jib having such a securing and locking unit and a crane having such a telescoping jib are disclosed that have a simpler and overall more cost-effective design despite having high detection security for the induction sensor assembly thereof.

In accordance with an aspect of the invention, an induction sensor assembly is proposed in which the active switching surface of the signal transmitter and the main plane are inclined with respect to each other. The advantage produced thereby can be seen in the fact that, by inclining the signal transmitter, the substantially triangular detection region thereof is also inclined. The consequence of a possible displacement between the signal transmitter and switching element is hereby attenuated by virtue of the fact that this is now no longer in parallel with the longitudinal axis of the signal transmitter but is at an angle to its now inclined longitudinal axis. As a result, for instance at least one of the sides of the detection region extending towards the tip is oriented further in the direction of a vertical, and so the angle between the main plane and this side of the detection region is increased. In the ideal case, the inclination of the signal transmitter turns out to be so large that the side of its detection region extends in a virtually perpendicular manner. It is thereby ensured that the signal transmitter enters the detection region irrespective of any possible displacement at the same position in relation to the adjusting direction. In other words, the displacement thereof would then occur in parallel with said side of the substantially triangular detection region, and so no effects are caused thereby. Therefore, simply owing to the inventive inclination of the active switching surface of the signal transmitter or of the entire signal transmitter, it is possible to substantially dispense with a complex and in this respect cost-intensive parallel distance guide between the signal transmitter and switching element with respect to each other.

According to a particular embodiment of the basic inventive concept, the active switching surface of the signal transmitter and a surface of the switching element provided for detection by the electromagnetic stray field can be inclined with respect to each other. In this manner, the previously described advantageous effect is further increased in the event of a possible displacement. This inclination can contribute to the fact that the surface of the switching element provided for detection by the signal transmitter is brought even closer to the side of the detection region extending as vertically as possible. In the ideal case, said surface is inclined with respect to the active switching surface of the signal transmitter such that it extends substantially in parallel with the relevant side of the detection region.

The shape of the electromagnetic stray field, which can be produced, of the signal transmitters can have a response curve, wherein a tangent to a middle point of the response curve can advantageously form an angle of 90° between itself and the main plane. Alternatively or in addition thereto, a secant intersecting the end points of the response curve can form an angle of 90° between itself and the main plane. Such an orientation of the electromagnetic stray field defining the detection region has extremely high precision in terms of its detection, because any displacement of the switching element with respect to the signal transmitter occurs virtually in parallel along the side of the detection region substantially described by the tangent, and in this respect exerts an influence which is as low as possible.

In accordance with another particular embodiment, the induction sensor assembly in accordance with the invention can also provide two signal transmitters. The active switching surfaces thereof are inclined with respect to the main plane such that the longitudinal axes of the two signal transmitters intersect. The precision in relation to the correct detection of the switching element can hereby be increased once again. For instance, the two signal transmitters can be used in order to determine the precise location of the switching element between the two detection regions thereof. Owing to the inventive inclination of the signal transmitters, a possible displacement of the switching element can be disregarded because said switching element always passes at the same position in relation to the adjusting direction into the detection regions thereof even at different height levels.

On this basis, it is considered to be advantageous if the longitudinal axes of the two signal transmitters extend in a vertical plane extending perpendicularly to the main plane. It is thereby ensured that the detection regions thereof are ideally oriented with respect to each other in order to recognize or determine the switching element despite possible tolerances in relation to a possible displacement of the switching element always in the same position of the switching element in relation to the adjusting direction.

It is further considered to be advantageous within the scope of the invention if the adjusting direction extends in the vertical plane. Alternatively, the adjusting direction can be an orthogonal to the vertical plane. The fixing of the respectively more advantageous orientation is the responsibility of the person skilled in the art who, for this purpose, will consider the respective configurations and requirements in the individual case.

Basically, the switching element can have a main body, wherein the surface of the switching element provided for detection by the respective electromagnetic stray field of the signal transmitters can be located on sides of the main body facing away from each other. This means that the main body of the switching element can be detected almost between the two detection regions of the signal transmitters, wherein the opposite edges thereof or the edges of the main body located there serve for insertion into the detection regions.

As an alternative, the main body can also comprise a groove delimited by two mutually facing, in particular parallel, wall regions. In so doing, the surfaces of the switching element provided for detection by the respective electromagnetic stray field of the signal transmitters can be located on these wall regions.

The induction sensor assembly in accordance with the invention permits an extremely simple and overall cost-effective installation, for example in or as a component of a securing and locking unit of a telescoping jib. Owing to the inventive deviation away from the otherwise usual parallel orientation of the active switching surface of the at least one signal transmitter with respect to the surface of the switching element provided for detection by the electromagnetic stray field, the disadvantage produced from the natural shape of the electromagnetic stray field in the case of an alternating displacement between the signal transmitter and switching element, which is possible during operation, is substantially neutralized. An otherwise usual and complex distance guide between the signal transmitter and switching element can be omitted in this respect or can at least be configured in a clearly simpler manner. In this way, not only can the costs and the structural outlay be lowered, because the omission or at least the reduction of the distance guide requires less space, but components can also be smaller in size and in this respect can likewise be produced in a more cost-effective manner and be simpler in design. Finally, the precision in the response behavior ensures an extremely low failure and loss ratio, even in the case of a possible displacement between the signal transmitter and switching element, whereby the number of possible disruptions caused by jamming, wear and maintenance and replacement of parts can be minimized.

Furthermore, the invention is directed to a securing and locking unit which comprises an induction sensor assembly in accordance with the invention, as described above. The advantages which can be achieved thereby correspond to those already explained for the induction sensor assembly in accordance with the invention and so to avoid repetition reference is made at this juncture to the previous statements relating thereto.

The invention is also directed to a telescoping jib, in particular for a crane, which has a securing and locking unit in accordance with the invention as discussed above or has simply an inventive induction sensor assembly, likewise as already described above. The advantages which can be achieved thereby likewise correspond to those already explained for the induction sensor assembly in accordance with the invention and so to avoid repetition reference is also made at this juncture to the previous statements relating thereto. Finally, the invention is also directed to a crane which is equipped with a telescoping jib as described above. The advantages which can be achieved thereby likewise result from the explanations given in connection with the induction sensor assembly in accordance with the invention and so reference is also made at this juncture to the corresponding statements relating thereto.

An exemplified embodiment of the invention will be explained in greater detail with reference to the following description. In the drawings.

BRIEF DESCRIPTION OF THE DRAWINGS

DESCRIPTION OF THE PREFERRED EMBODIMENTS

Figure 1A:
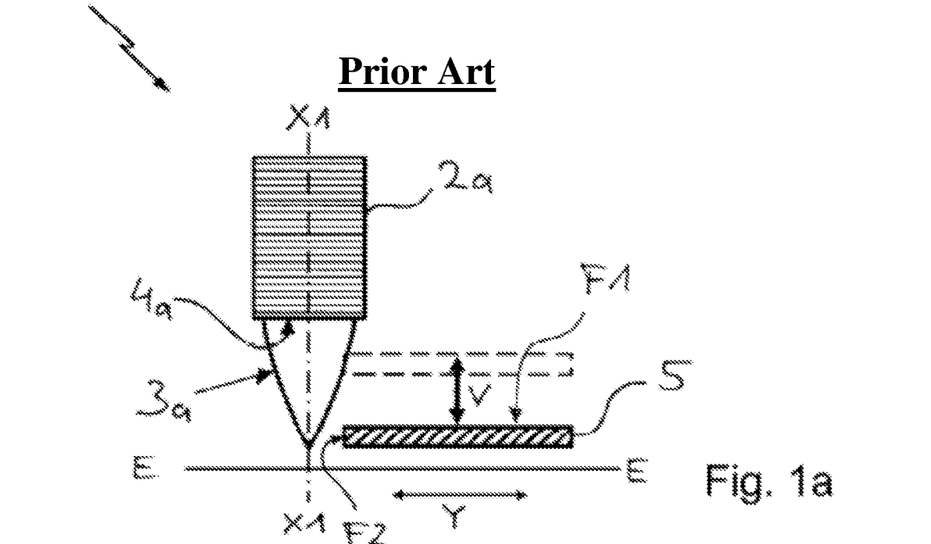
FIG. 1a shows an induction sensor assembly from the prior art in a schematic view.

FIG. 1 shows the schematic design of an induction sensor assembly 1 from the prior art. In this case, the induction sensor assembly 1 comprises a single signal transmitter 2a which is formed as an inductive proximity switch. The signal transmitter 2a is configured to generate an electromagnetic stray field 3a as required. The signal transmitter 2a extending in the direction of its longitudinal axis X1 has an active switching surface 4a located at the end thereof, the electromagnetic stray field 3a being oriented towards said switching surface. In other words, the electromagnetic stray field 3a leaves the signal transmitter 2a in the region of its active switching surface 4a. As can be seen, the electromagnetic stray field 3a defining a detection region has a shape which can be referred to substantially as a triangle having curved sides. Furthermore, the induction sensor assembly 1 comprises a switching element 5 which is provided for contactless cooperation with the signal transmitter 2a. Such switching elements 5 are generally occasionally also known under the term "switching lug". The switching element 5 and signal transmitter 2a can be displaced relative to each other in relation to an adjusting direction Y. The adjusting direction Y extends in parallel with a main plane E, wherein the active switching surface 4a of the signal transmitter 2a likewise extends in parallel with the main plane E. A surface F1 of the switching element 5 provided for detection by the electromagnetic stray field 3a likewise extends in parallel with the main plane E.

As can be seen, the signal transmitter 2a and switching element 5 can assume an undesired displacement V with respect to each other during operation of the induction sensor assembly 1. Owing to the displacement V, it is not ensured that the switching element 5 is always detected at the same position relative to the signal transmitter 2a. A reason for this is the natural shape of the electromagnetic stray field 3a. With reference to the illustration in FIG. 1a, the switching element 5 cannot be detected by the electromagnetic stray field 3a without changing its position in relation to the adjusting direction Y, when this has a displacement V towards the main plane E. In contrast, the switching element 5 is detected as soon as its displacement V is reduced or the switching element 5 assumes a position located in the opposite direction away from the main plane E (indicated by broken lines). In this manner, only unsatisfactory precision in relation to the position recognition of the switching element 5 relative to the signal transmitter 2a is possible. In order to minimize the possible displacement V as much as possible, a correspondingly complex structural distance guide is required (not shown).

Figure 1B:
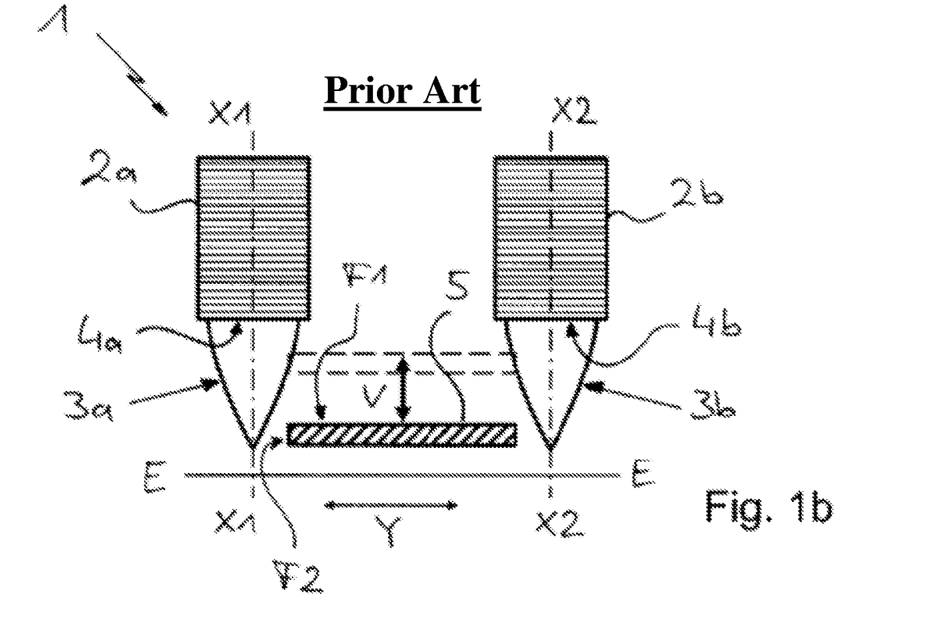
FIG. 1b shows another induction sensor assembly from the prior art in a schematic view.

FIG. 1b shows another induction sensor assembly 1 from the prior art in a schematic illustration. As can be seen, this induction sensor assembly 1 now comprises two signal transmitters 2a, 2b, the two longitudinal axes X1, X2 of which extend in a parallel and spaced apart manner. Furthermore, the active switching surfaces 4a, 4b thereof are oriented in parallel with the main plane E. The increase in the number of signal transmitters 2a, 2b also does not result in any improvement in relation to the precision of the detection of the switching element 5, because even in this case the shape of the electromagnetic stray fields 3a, 3b continues to be reactive in response to a displacement V between the signal transmitters 2a, 2b and the switching element 5. For instance, in this case the switching element 5 also cannot be detected outside of the two electromagnetic stray fields 3a, 3b and in this respect in the case of a displacement V in the direction of the main plane E whilst its displacement in the opposite direction results in it entering the electromagnetic stray fields 3a, 3b and thus in the detection thereof without a change in its position in relation to the adjusting direction Y (indicated by broken lines).

Figure 2A:
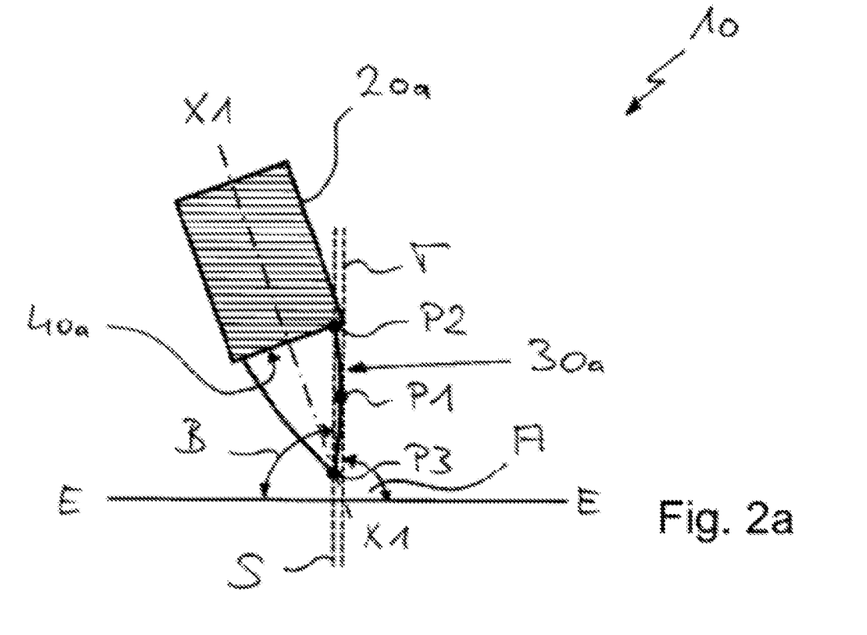
FIG. 2a shows part of an induction sensor assembly in accordance with the invention for a securing and locking unit in a schematic view.

FIG. 2a shows a signal transmitter 20a of an induction sensor assembly 10 in accordance with the invention. As can be seen, the active switching surface 40a thereof is now inclined with respect to the main plane E. Upon more detailed consideration of its electromagnetic stray field 30a, it is clear that the curved sides thereof each describe a response curve. A tangent T to a middle point P1 of a response curve forms an angle A of 90° between itself and the main plane E. This is also true for a secant S intersecting the opposite end points P2, P3 of a response curve, which secant likewise forms an angle B of 90° between itself and the main plane E.

Figure 2B:
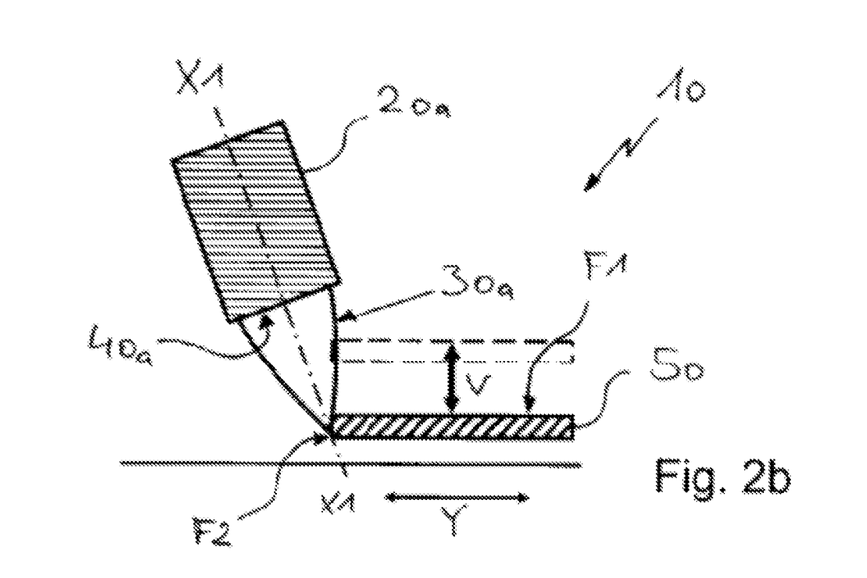
FIG. 2b shows an induction sensor assembly in accordance with the invention for a securing and locking unit in a schematic view.

FIG. 2b shows the induction sensor assembly 10 in accordance with the invention from FIG. 2a in combination with a switch or switch element or switching element 50. The illustration clarifies the positive effect produced by the inclination in accordance with the invention. As can be seen, a possible displacement V of the switching element 50 does not have an effect, or only has an insignificant effect, on the detection by the signal transmitter 20a. This is substantiated in that the electromagnetic stray field 30a is advantageously oriented with respect to the switching element 50 owing to the inclination of the signal transmitter 20a or its active switching surface 40a. The side of the electromagnetic stray field 30a facing the switching element 30a now extends substantially in parallel with the direction of the possible displacement V owing to its orientation described in more detail in relation to FIG. 2a. In this respect, it is irrelevant at which height of the displacement V e.g. the switching element 50 impinges upon the electromagnetic stray field 30a of the signal transmitter 20a. In other words, the detection of the switching element 50, which remains stationary in relation to the adjusting direction Y, is not affected when this undergoes a displacement V (indicated by broken lines). In the case of a displacement V, the surface F2 of the switching element 50 extends virtually along the response curve of the electromagnetic stray field 30a, without causing a change in relation to the detection. Furthermore, it can be seen that the surface F1 of the switching element 50 and the active switching surface 40a are inclined with respect to each other.

Figure 3A:
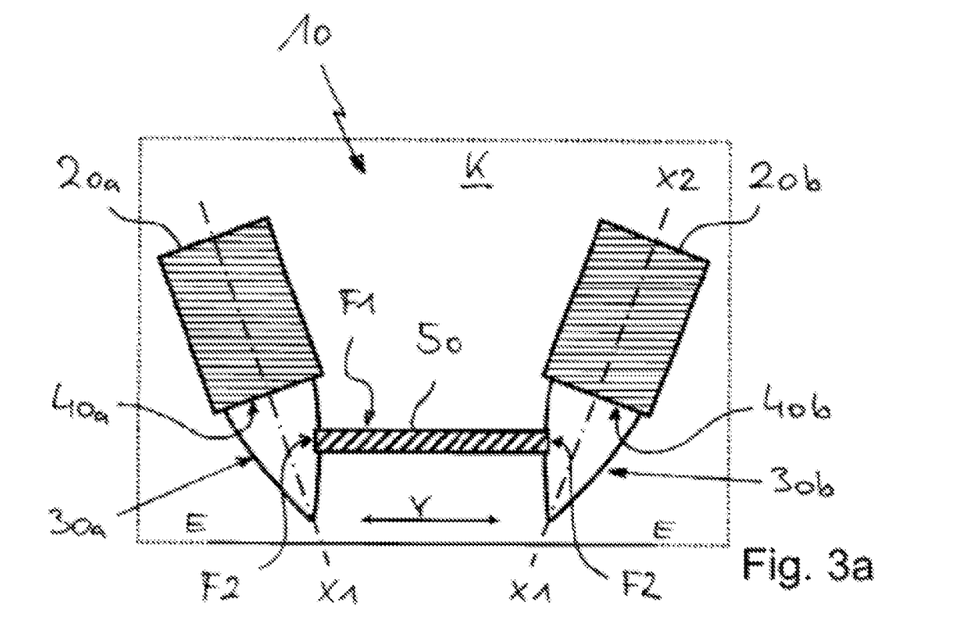
FIG. 3a shows an alternative design of the induction sensor assembly in accordance with the invention from FIG. 2b in a schematic view.

FIG. 3a shows an alternative design of the induction sensor assembly 10 in accordance with the invention, which now comprises two signal transmitters 20a, 20b. The active switching surfaces 40a, 40b thereof are inclined with respect to the main plane E such that the longitudinal axes X1, X2 of the signal transmitters 20a, 20b intersect (in a notional extension of their directions). In so doing, the two signal transmitters 20a, 20b extend in a common vertical plane K. In the present case, the adjusting direction Y extends in this vertical plane K. Alternatively thereto, the adjusting direction U can also be an orthogonal to the vertical plane K (not shown). The signal transmitters 20a, 20b in this case inclined with respect to each other by way of example in relation to their active switching surfaces 40a, 40b enclose the switching element 50 between their electromagnetic stray fields 30a, 30b.

Figure 3B:
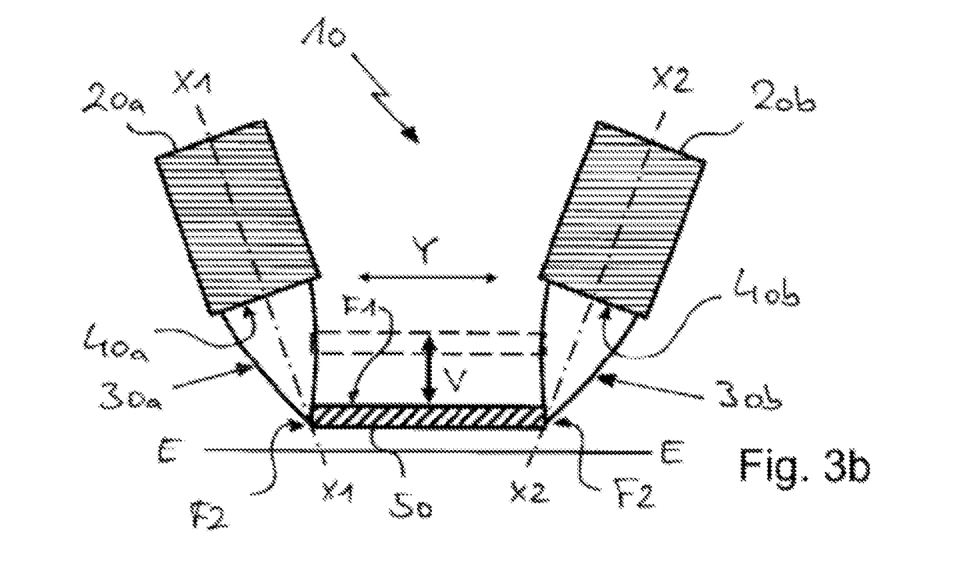
FIG. 3b shows the induction sensor assembly from FIG. 3a with mutually displaced components.

FIG. 3b shows that, even in the case of the embodiment of the induction sensor assembly 10 in accordance with the invention already shown in FIG. 3a, a possible displacement V of the switching element 50 does not play a substantial role in the detection thereof, because this moves with its surfaces F2 facing away from each other, in the case of a displacement V, substantially along the response curves of the electromagnetic stray fields 30a, 30b.

Figure 4A:
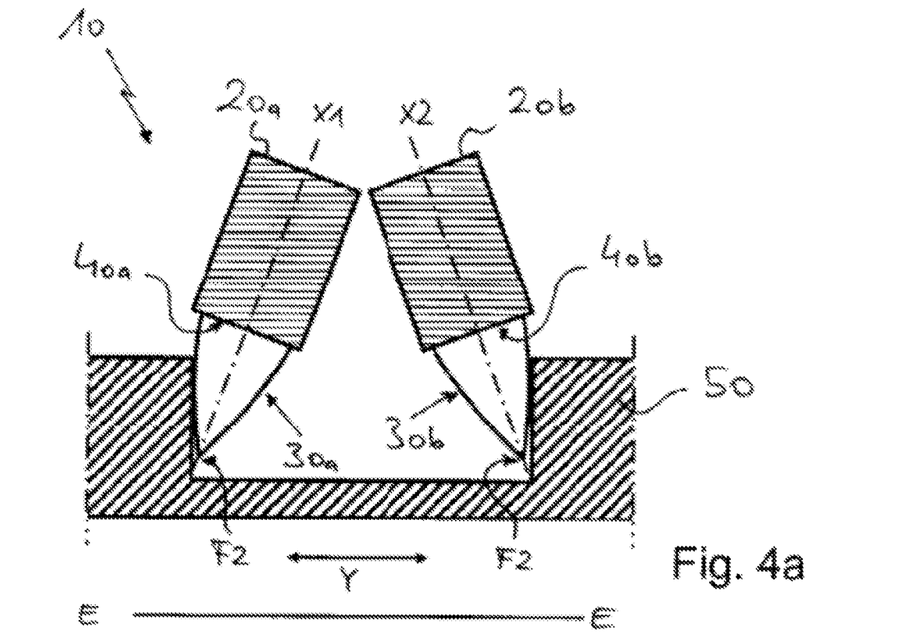
FIG. 4a shows a further alternative design of the induction sensor assembly in accordance with the invention from FIG. 2b and FIG. 3a as well as FIG. 3b in a schematic view.
Figure 4B:
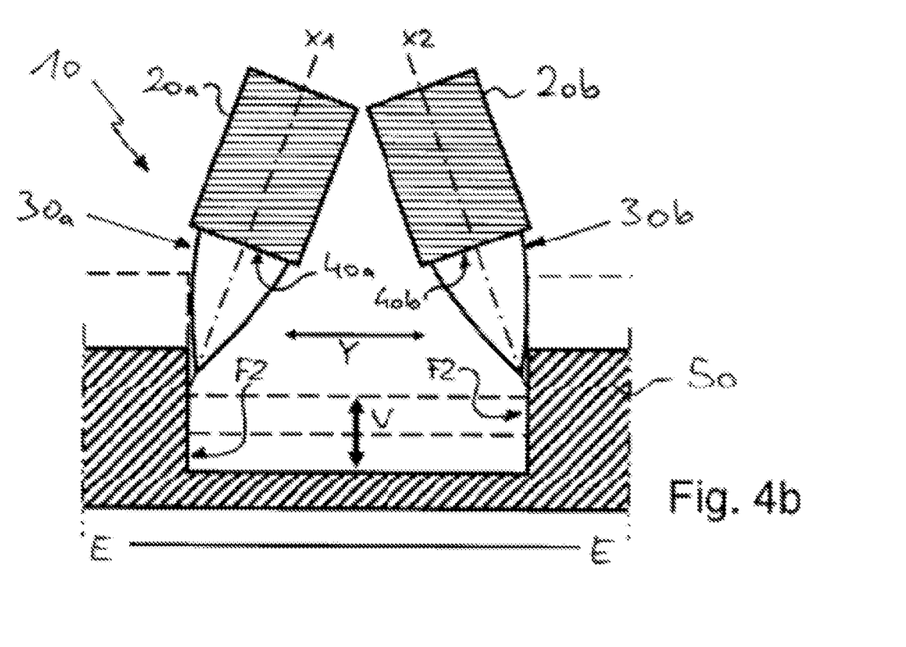
FIG. 4b shows the induction sensor assembly from FIG. 4a with mutually displaced components.

FIG. 4a and FIG. 4b show another alternative design of the induction sensor assembly 10 in accordance with the invention. As can be seen, the two signal transmitters 20a, 20b thereof are initially inclined with respect to each other in a different direction from that in FIG. 3a and FIG. 3b. Furthermore, the main body of the switching element 50 now has a groove which is delimited by two opposing wall regions. It can be seen that the two wall regions are configured in parallel with each other. The wall regions are the surfaces F2 provided for detection. As can be seen in particular in FIG. 4b, in this case a potential displacement V between the signal transmitters 20a, 20b and the switching element 50 also does not have a further effect on the detection thereof, because the surfaces F2 located at the wall regions move virtually along the response curves of the electromagnetic stray fields 30a, 30b.

Figure 5:
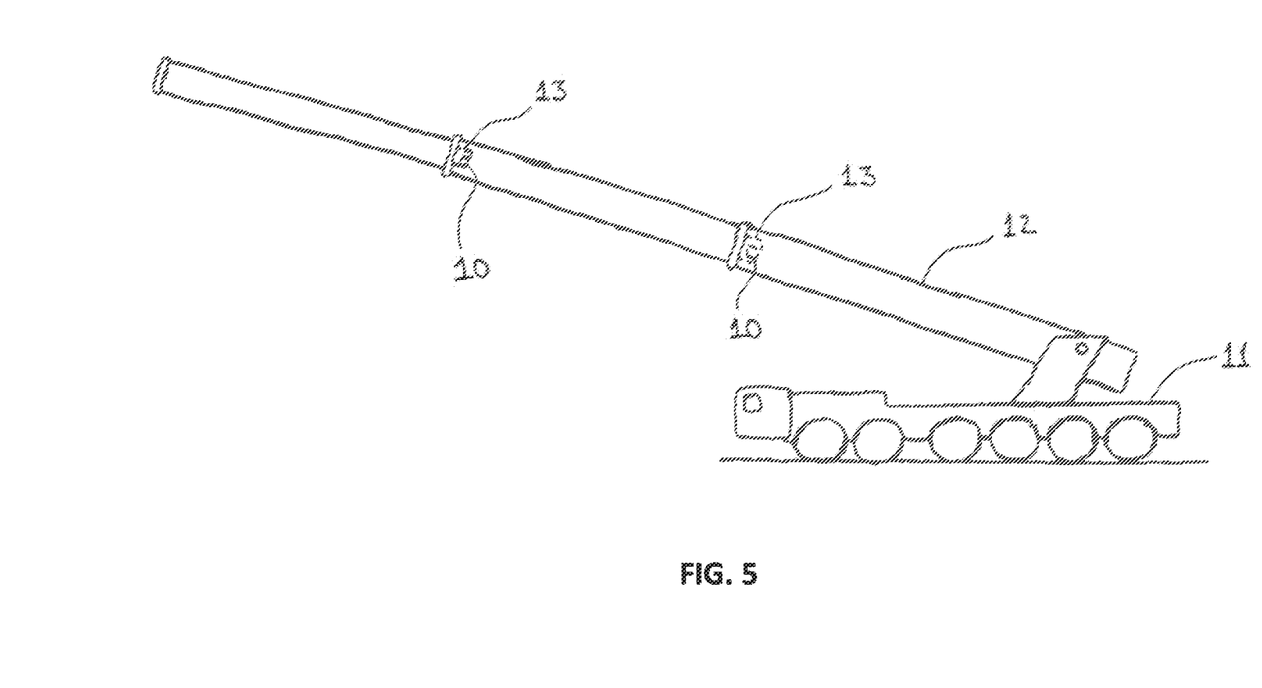
FIG. 5 shows a mobile crane with a telescoping jib and securing and locking units.

FIG. 5 illustrates a mobile crane 11 having a telescopic jib 12 that includes securing and locking units 13 with induction sensor assemblies 10.

It is understood that when using the induction sensor assembly 10 in accordance with the invention for a securing and locking unit of a telescoping jib of a vehicle crane, the surfaces F2 provided for detection are contours of bolts of the securing and locking unit or of openings for bolts in the basic box and/or the inner boxes of the telescoping jib. The surfaces F2 can also be provided by other suitable contours, which are present or are provided specifically for this purpose, on the securing and locking unit, the basic box and/or the inner boxes in order to check the orientation of the basic box or inner boxes and the securing and locking unit which is required for secure operation of the securing and locking unit.

The embodiments of the invention in which an exclusive property or privilege is claimed are defined as follows:

1. An induction sensor assembly of a securing and locking unit of a telescoping jib, said induction sensor assembly comprising:
   at least one signal transmitter configured to generate an electromagnetic stray field oriented towards an active switching surface of the signal transmitter; and
   at least one switching element that is provided for contactless cooperation with the signal transmitter;
   wherein the signal transmitter and the switching element are displaceable relative to each other in relation to an adjusting direction extending in parallel with a main plane, and wherein the active switching surface of the signal transmitter and the main plane are inclined with respect to each other.

2. The induction sensor assembly as claimed in claim 1, wherein the active switching surface and a surface of the switching element provided for detection by the electromagnetic stray field are inclined with respect to each other.

3. The induction sensor assembly as claimed in claim 2, wherein the shape of the electromagnetic stray field generated by the signal transmitter has a response curve, and wherein a tangent to a middle point of the response curve and/or a secant intersecting end points of the response curve form(s) an angle of 90 degrees between itself/themselves and the main plane.

4. The induction sensor assembly as claimed in claim 3, wherein said at least one signal transmitter comprises two signal transmitters that each include an active switching surface, and wherein the active switching surfaces of the signal transmitters are inclined with respect to the main plane such that the longitudinal axes of the signal transmitters intersect.

5. The induction sensor assembly as claimed in claim 4, wherein the longitudinal axes of the signal transmitters extend in a vertical plane extending perpendicularly to the main plane.

6. The induction sensor assembly as claimed in claim 5, wherein the adjusting direction extends in the vertical plane or is an orthogonal to the vertical plane.

7. The induction sensor assembly as claimed in claim 6, wherein the switching element has a main body, and wherein surfaces of the switching element provided for detection by the respective electromagnetic stray field of the signal transmitters are located on sides of the main body facing away from each other.

8. The induction sensor assembly as claimed in claim 6, wherein the switching element has a main body that comprises a groove delimited by two mutually facing and parallel wall regions, wherein surfaces of the switching element provided for detection by the respective electromagnetic stray field of the signal transmitters are located on the wall regions.

9. The induction sensor assembly as claimed in claim 1, wherein the shape of the electromagnetic stray field generated by the signal transmitter has a response curve, and wherein a tangent to a middle point of the response curve and/or a secant intersecting end points of the response curve form(s) an angle of 90 degrees between itself/themselves and the main plane.

10. The induction sensor assembly as claimed in claim 1, wherein said at least one signal transmitter comprises two signal transmitters that each include an active switching surface, and wherein the active switching surfaces of the signal transmitters are inclined with respect to the main plane such that the longitudinal axes of the signal transmitters intersect.

11. The induction sensor assembly as claimed in claim 10, wherein the longitudinal axes of the signal transmitters extend in a vertical plane extending perpendicularly to the main plane.

12. The induction sensor assembly as claimed in claim 11, wherein the adjusting direction extends in the vertical plane or is an orthogonal to the vertical plane.

13. The induction sensor assembly as claimed in claim 10, wherein the switching element has a main body, and wherein surfaces of the switching element provided for detection by the respective electromagnetic stray field of the signal transmitters are located on sides of the main body facing away from each other.

14. The induction sensor assembly as claimed in claim 10, wherein the switching element has a main body that comprises a groove delimited by two mutually facing wall regions, wherein surfaces of the switching element provided for detection by the respective electromagnetic stray field of the signal transmitters are located on the wall regions.

15. The induction sensor assembly as claimed in claim 14, wherein the two mutually facing wall regions are parallel.

16. A securing and locking unit, said securing and locking unit comprising:
   an induction sensor assembly comprising at least one signal transmitter and at least one switching element;
   wherein the signal transmitter is configured to generate an electromagnetic stray field oriented towards an active switching surface of the signal transmitter;
   wherein the switching element is provided for contactless cooperation with the signal transmitter; and
   wherein the signal transmitter and the switching element are displaceable relative to each other in relation to an adjusting direction extending in parallel with a main plane, and wherein the active switching surface of the signal transmitter and the main plane are inclined with respect to each other.

17. The securing and locking unit of claim 16, wherein the active switching surface and a surface of the switching element provided for detection by the electromagnetic stray field are inclined with respect to each other.

18. A telescoping jib, said telescoping jib comprising:
   a securing and locking unit, said securing and locking unit comprising an induction sensor assembly comprising at least one signal transmitter and at least one switching element;
   wherein the signal transmitter is configured to generate an electromagnetic stray field oriented towards an active switching surface of the signal transmitter;
   wherein the switching element is provided for contactless cooperation with the signal transmitter; and
   wherein the signal transmitter and the switching element are displaceable relative to each other in relation to an adjusting direction extending in parallel with a main plane, and wherein the active switching surface of the signal transmitter and the main plane are inclined with respect to each other.

19. The telescoping jib of claim 18, wherein the active switching surface and a surface of the switching element provided for detection by the electromagnetic stray field are inclined with respect to each other.

20. The telescoping jib of claim 18, wherein said telescoping jib is part of a crane.

* * * * *